US012568847B2

(12) United States Patent
Yu et al.

(10) Patent No.: US 12,568,847 B2
(45) Date of Patent: Mar. 3, 2026

(54) CHIP PACKAGE AND METHOD OF MANUFACTURING THE SAME

(71) Applicant: WALTON ADVANCED ENGINEERING, INC., Kaohsiung (TW)

(72) Inventors: Hong-Chi Yu, Kaohsiung (TW); Chun-Jung Lin, Kaohsiung (TW); Ruei-Ting Gu, Kaohsiung (TW)

(73) Assignee: WALTON ADVANCED ENGINEERING, INC., Kaohsiung (TW)

( * ) Notice: Subject to any disclaimer, the term of this patent is extended or adjusted under 35 U.S.C. 154(b) by 386 days.

(21) Appl. No.: 18/206,598

(22) Filed: Jun. 6, 2023

(65) Prior Publication Data

US 2023/0395453 A1    Dec. 7, 2023

(30) Foreign Application Priority Data

Jun. 7, 2022    (TW) .................................. 111121070

(51) Int. Cl.
| | |
|---|---|
| *H01L 23/31* | (2006.01) |
| *H01L 21/56* | (2006.01) |
| *H01L 21/78* | (2006.01) |
| *H01L 23/00* | (2006.01) |
| *H01L 23/29* | (2006.01) |

(52) U.S. Cl.
CPC .......... *H01L 23/3192* (2013.01); *H01L 21/56* (2013.01); *H01L 21/78* (2013.01); *H01L 23/3135* (2013.01); *H01L 24/05* (2013.01);

*H01L 24/13* (2013.01); *H01L 23/293* (2013.01); *H01L 2224/05573* (2013.01); *H01L 2224/1302* (2013.01)

(58) Field of Classification Search
CPC ..... H01L 23/3192; H01L 21/56; H01L 21/78; H01L 23/3135; H01L 24/05; H01L 24/13; H01L 23/293; H01L 2224/05573; H01L 2224/1302; H01L 21/561; H01L 23/3114; H01L 23/31; H01L 23/482; H01L 23/488; H01L 24/96
See application file for complete search history.

(56) References Cited

U.S. PATENT DOCUMENTS

| | | | | |
|---|---|---|---|---|
| 10,177,115 B2 * | 1/2019 | Yu | ....................... | H01L 21/6836 |
| 10,573,571 B2 * | 2/2020 | Park | ..................... | H10D 84/013 |
| 10,797,681 B1 * | 10/2020 | Hurwitz | ............ | H01L 21/76871 |
| 2020/0075546 A1 * | 3/2020 | Shih | ....................... | H01L 21/561 |
| 2020/0161210 A1 * | 5/2020 | Dadvand | ................ | C23C 18/38 |
| 2020/0411429 A1 * | 12/2020 | Dadvand | ........... | H01L 21/76877 |
| 2021/0225708 A1 * | 7/2021 | Lee | ....................... | H01L 23/147 |

* cited by examiner

*Primary Examiner* — Thanh T Nguyen
(74) *Attorney, Agent, or Firm* — Fei-hung Yang

(57)        ABSTRACT

A chip package and a method of manufacturing the same are provided. The chip package includes at least one insulating protective layer disposed on a periphery of a surface of a seed layer correspondingly. A plurality of insulating protective layers is arranged at the seed layer of a plurality of rectangular chips of a wafer and located corresponding to a plurality of dicing streets. Thereby cutting tools only cut the insulating protective layer, without cutting a thick metal layer during cutting process. The insulating protective layer is formed on a periphery of the thick metal layer of the chip package after the cutting process.

6 Claims, 5 Drawing Sheets

CHIP PACKAGE AND METHOD OF MANUFACTURING THE SAME

CROSS-REFERENCE TO RELATED APPLICATIONS

This non-provisional application claims priority under 35 U.S.C. § 119(a) on Patent Application No(s). 111121070 filed in Taiwan, R.O.C. on Jun. 7, 2022, the entire contents of which are hereby incorporated by reference.

BACKGROUND OF THE INVENTION

The present invention relates to a chip package and a method of manufacturing the same, especially to a chip package and a method of manufacturing the same for effectively addressing an issue of difficult cutting caused by metal materials and a certain thickness of a thick metal layer.

In a field of chip package, generally a plurality of chip packages is disposed on a wafer first and then the wafer is cut to get a plurality of the single chip packages. However, there are many disadvantages during the cutting when a thick metal layer is in the chip package (such as back side). For example, cutting tools are easily damaged while cutting the thick metal layer, or an edge of the respective chip packages (such as the edge of the thick metal layer) is chipping easily. Thereby quality of the chip package is affected.

SUMMARY OF THE INVENTION

Therefore, it is a primary object of the present invention to provide a chip package and a method of manufacturing the same. The chip package includes an insulating protective layer disposed on a periphery of a surface of a seed layer corresponding. By the insulating protective layers arranged at the seed layer of a plurality of rectangular chips on a wafer and corresponding to a plurality of dicing streets, cutting tools only cut the insulating protective layer, without cutting a thick metal layer during cutting process. The insulating protective layer is formed around the thick metal layer of the chip package after the cutting process.

In order to achieve the above objects, a chip package according to the present invention includes a rectangular chip, a seed layer, an insulating protective layer, and a thick metal layer. The rectangular chip consists of a first surface, a second surface opposite to the first surface, at least one die pad and at least one protective layer which are both arranged over the first surface, and a bump with a certain height disposed over the die pad. The protective layer is provided with an opening corresponding to the bump for allowing the bump to be exposed. The rectangular chip is formed by cutting a wafer. A plurality of the rectangular chips in an array and a plurality of dicing streets are disposed on a first surface of the wafer and the dicing street is formed between the two adjacent rectangular chips. The second surface of the rectangular chip is covered with the seed layer which is having a surface. The insulating protective layer is mounted to a periphery of the surface of the seed layer. A plurality of insulating protective layers is disposed on the seed layer of the respective rectangular chips on the wafer and corresponding to the respective dicing streets and then cut together with the respective dicing streets. Thereby the insulating protective layer is formed on the chip package. The thick metal layer is coated on the surface of the seed layer and located on an inner side of the insulating protective layer. Thus thick metal layer is wrapped by the insulating protective layer to be protected by the insulating protective layer.

A method of manufacturing chip packages includes the following steps.

Step 1: providing a wafer which is provided with a plurality of rectangular chips arranged in an array. The rectangular chip includes a first surface and a second surface opposite to the first surface, at least one die pad and at least one protective layer which are both arranged over the first surface, and a bump with a certain height disposed over the respective die pads. A first surface of the wafer is provided with a plurality of grooves each of which is arranged between the two adjacent rectangular chips. The groove is used to define a dicing street so that the dicing street is formed between the two adjacent rectangular chips and the wafer further includes a second surface opposite to the first surface.

Step 2: grinding the second surface of the wafer to form a third surface and the second surface of the respective rectangular chips is exposed on the third surface of the wafer.

Step 3: covering the third surface of the wafer with a seed layer so that the second surface of the respective rectangular chips is covered with the seed layer. A surface is formed on the seed layer.

Step 4: disposing a plurality of insulating protective layers on the surface of the seed layer correspondingly and the respective insulating protective layers are corresponding to the respective dicing streets. A width of the respective insulating protective layers is larger than a width of the respective dicing streets.

Step 5: coating a plurality of thick metal layers on the seed layer correspondingly and the respective thick metal layers are located on an inner side of the respective insulating protective layers.

Step 6: cutting along the respective dicing streets to separate the rectangular chips arranged in an array from the wafer and getting the respective chip packages. The thick metal layer of the chip package is wrapped by the insulating protective layer to be protected by the insulating protective layer.

DETAILED DESCRIPTION OF THE PREFERRED EMBODIMENT

In order to learn structure and technical features of the present invention, please refer to the following descriptions and related figures which are only used to explain relationship and functions of respective components of the present invention and sizes of the respective components are not drawn to real scale, and not intended to limit the scope of the present invention.

Figure 5:
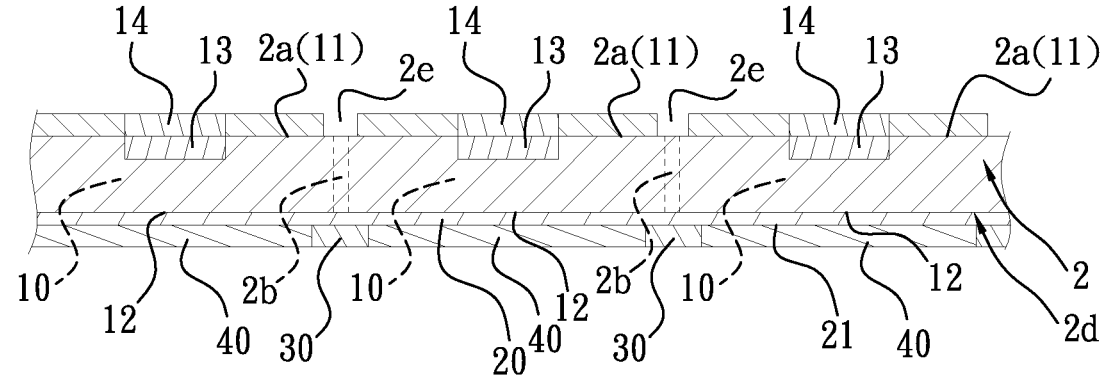
FIG. 5 is a side sectional view showing a plurality of thick metal layers disposed on the surface of the seed layer of the wafer in FIG. 4 according to the present invention.
Figure 6:
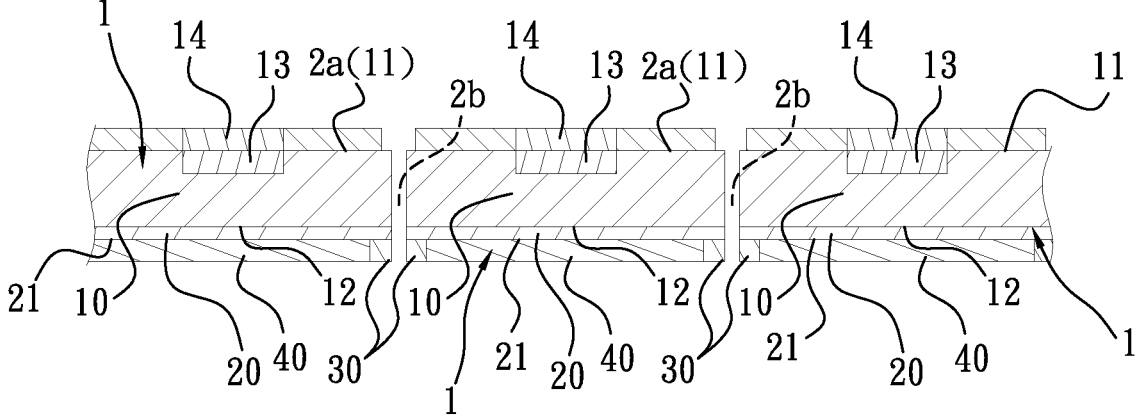
FIG. 6 is a side sectional view showing cutting of the wafer in FIG. 5 according to the present invention.
Figure 7:
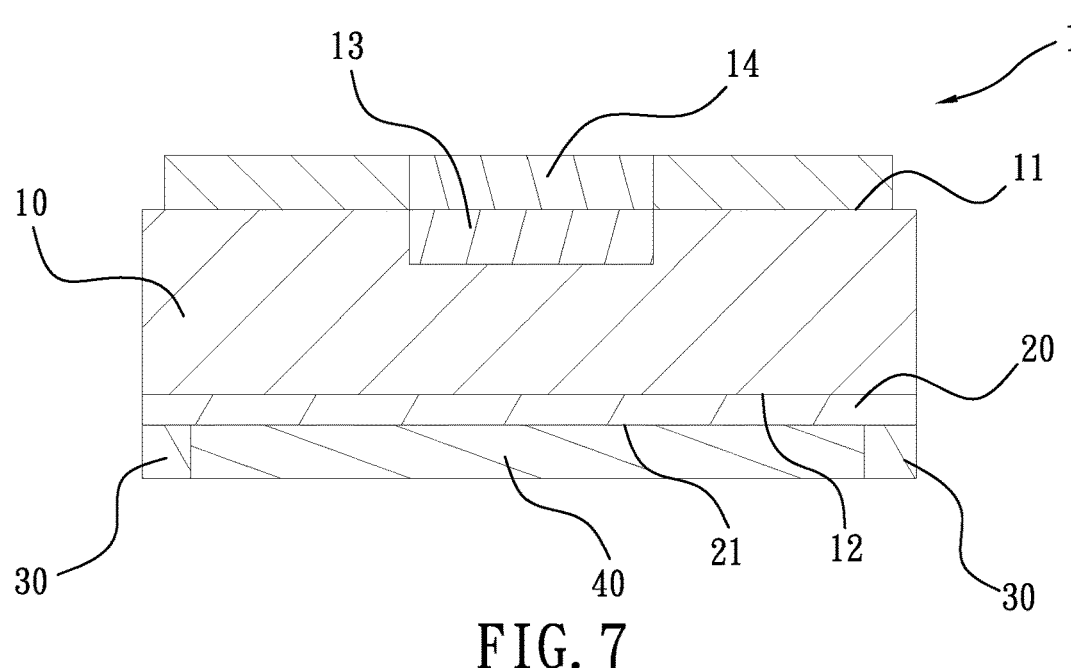
FIG. 7 is a side sectional view of a first embodiment according to the present invention.
Figure 13:
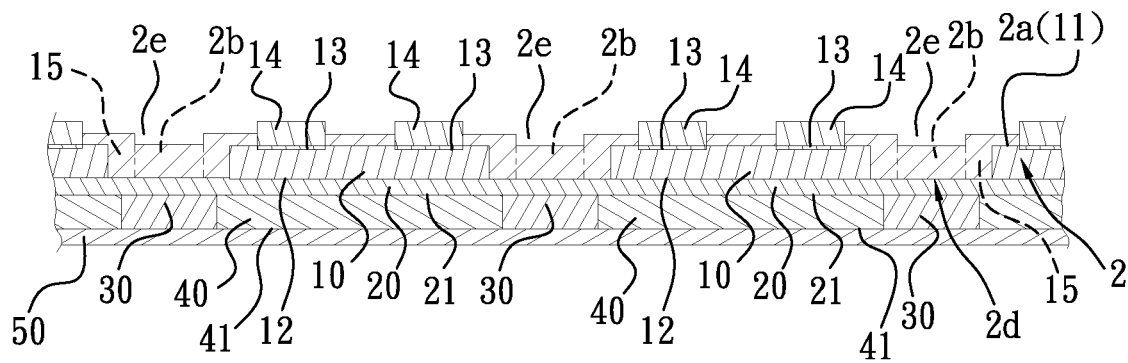
FIG. 13 is a side sectional view showing a plurality of protective layers disposed on the respective thick metal layers of the wafer in FIG. 12 according to the present invention.
Figure 14:
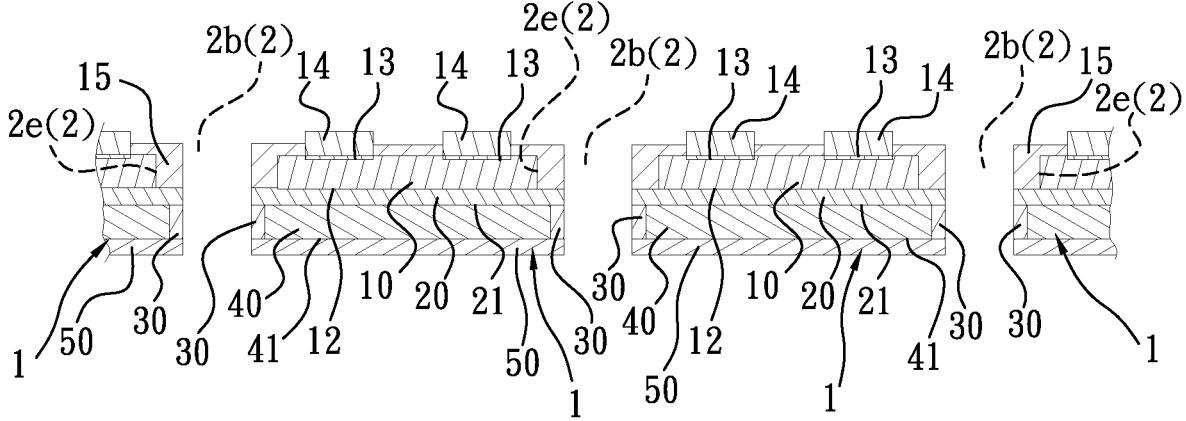
FIG. 14 is a side sectional view showing cutting of the wafer in FIG. 13 according to the present invention.
Figure 15:
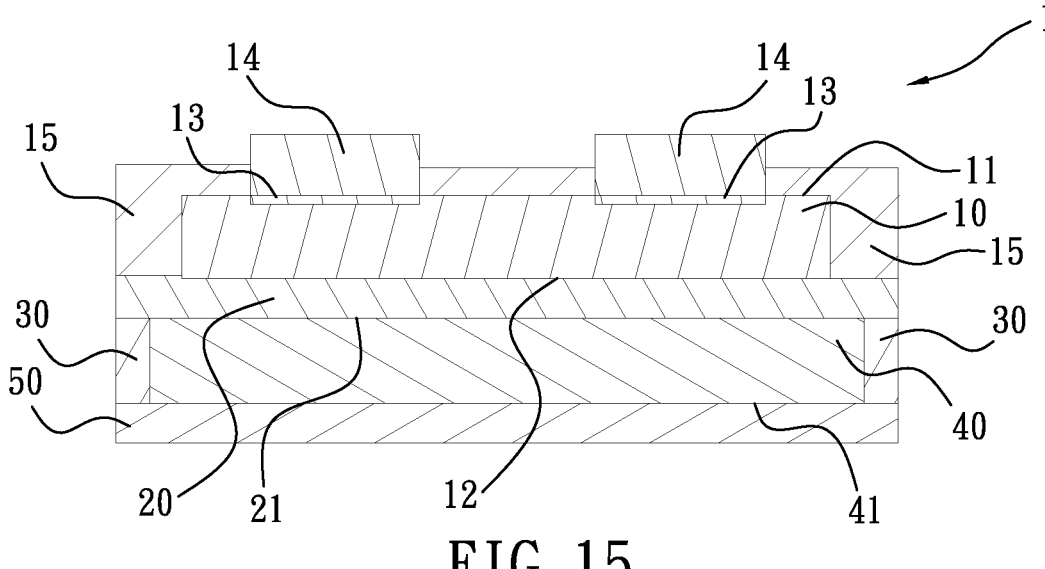
FIG. 15 is a side sectional view of a second embodiment according to the present invention.

Refer to FIG. 7 and FIG. 15, a chip package 1 according to the present invention includes a rectangular chip 10, a seed layer 20, an insulating protective layer 30, and a thick metal layer 40. According to different numbers of the protective layers arranged in the chip package 1, there are two embodiments, the first embodiment (as shown in FIG. 1-7) and the second embodiment (as shown in FIG. 8-15) which are described as follows.

Refer to FIG. 1-7, a first embodiment of the chip package 1 according to the present invention is provided.

The rectangular chip 10 consists of a first surface 11, a second surface 12 opposite to the first surface 11, at least one die pad 13 and at least one protective layer which are both arranged over the first surface 11, and a bump 14 having a certain height disposed over the respective die pads 13, as shown in FIG. 7. The protective layer is provided with an opening corresponding to the bump 14 for allowing the bump 14 to be exposed, as shown in FIG. 7. The rectangular chip 10 is formed by cutting a wafer 2. Refer to FIG. 5, a plurality of the rectangular chips 10 arranged in an array and a plurality of dicing streets 2b are disposed on a first surface 2 of the wafer 2 and the dicing street 2b is formed between the two adjacent rectangular chips 10.

The second surface 12 of the rectangular chip 10 is covered with the seed layer 20 and a surface 21 is formed on the second layer 2, as shown in FIG. 7. The seed layer 20 is used for precise control of size, shape, or thickness of the thick metal layer 40 so as to improve yield rate of products and further reduce production cost.

The insulating protective layer 30 is mounted to a periphery of the surface 21 of the seed layer 20, as shown in FIG. 7. As shown in FIG. 5, a plurality of insulating protective layers 30 is disposed on the seed layer 20 of the respective rectangular chips 10 on the wafer 2 and corresponding to the respective dicing streets 2 for being cut together with the respective dicing streets 2b later, as shown in FIG. 6. Thereby the insulating protective layer 30 is formed on the chip package 1, as shown in FIG. 7.

The insulating protective layer 30 is made of resin materials, but not limited, in order to be cut easier than metal materials during wafer dicing.

The thick metal layer 40 is coated on the surface 21 of the seed layer 20 and located on an inner side of the insulating protective layer 30. Thus thick metal layer 40 is wrapped by the insulating protective layer 30 to be protected by the insulating protective layer 30, as shown in FIG. 7.

The thick metal layer 40 can be made of copper, but not limited, to improve functions such as heat dissipation or electrical resistance of the chip package 1.

Refer to FIG. 1-6, a method of manufacturing the first embodiment of the chip package 1 according to the present invention includes the following steps.

Figure 1:
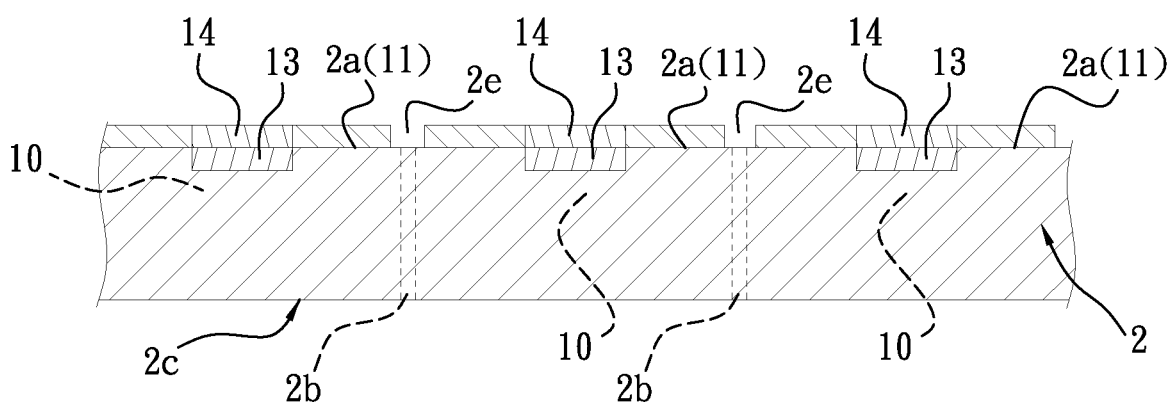
FIG. 1 is a side sectional view of a first embodiment in which a plurality of bumps formed on respective die pads of a wafer according to the present invention.

Step 1: providing a wafer 2 which is provided with a plurality of rectangular chips 10 arranged in an array. Each of the rectangular chips 10 includes a first surface 11 and a second surface 12 opposite to the first surface 11, at least one die pad 13 and at least one protective layer arranged over the first surface 11, and a bump 14 with a certain height disposed over the respective die pads 13, as shown in FIG. 1. A first surface 2a of the wafer 2 is provided with a plurality of grooves 2e each of which is arranged between the two adjacent rectangular chips 10 and used for defining a dicing street 2b. Thereby the dicing street 2b is formed between the two adjacent rectangular chips 10, as shown in FIG. 1. The wafer 2 further includes a second surface 2c opposite to the first surface 2a, as shown in FIG. 1.

Figure 2:
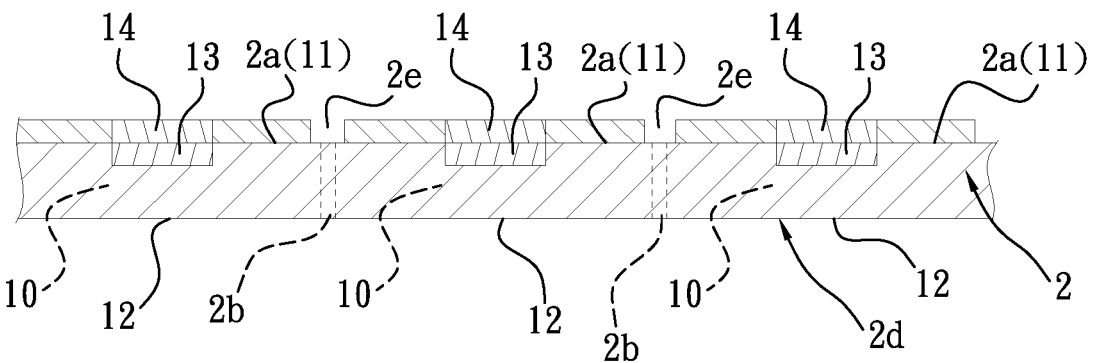
FIG. 2 is a side sectional view showing a third surface of the wafer in FIG. 1 exposed after grinding according to the present invention

Step 2: grinding the second surface 2c of the wafer 2 to form a third surface 2d, as shown in FIG. 1 and FIG. 2, and the second surface 12 of the respective rectangular chips 10 is exposed on the third surface 2d of the wafer 2, as shown in FIG. 2.

Figure 3:
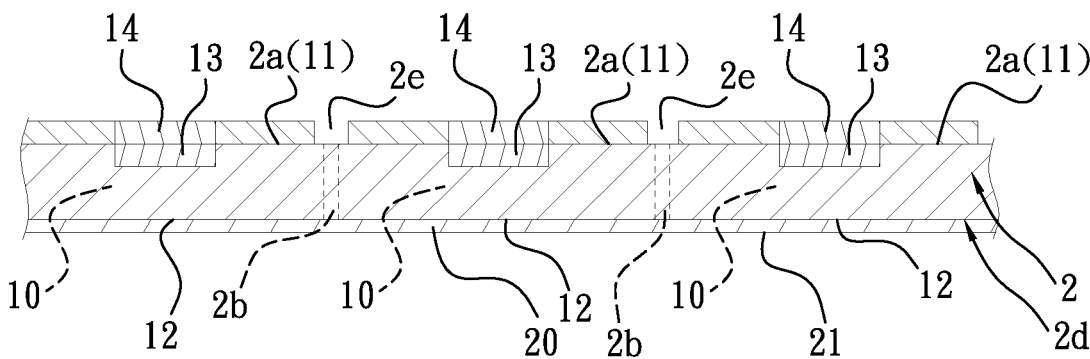
FIG. 3 is a side sectional view showing a seed layer covering the third surface of the wafer in FIG. 2 according to the present invention.

Step 3: covering the third surface 2d of the wafer 2 with a seed layer so that the second surface 12 of the respective rectangular chips 10 is provided and covered with the seed layer 20, as shown in FIG. 3. A surface 21 is formed on seed layer 20, as shown in FIG. 3.

Figure 4:
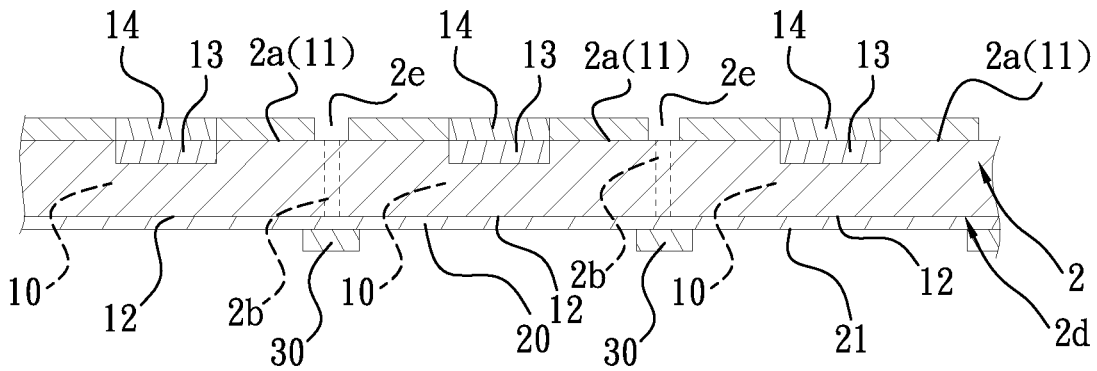
FIG. 4 is a side sectional view showing a plurality of insulating protective layers disposed on a surface of the seed layer of the wafer in FIG. 3 according to the present invention.

Step 4: disposing a plurality of the insulating protective layers 30 on the surface 21 of the seed layer 20 correspondingly and the respective insulating protective layers 30 are corresponding to the respective dicing streets 2b, as shown in FIG. 4. A width of the respective insulating protective layers 30 is larger than a width of the respective dicing streets 2b, as shown in FIG. 4.

Step 5: coating a plurality of thick metal layers 40 on the seed layer 20 correspondingly and the respective thick metal layers 40 are located on an inner side of the respective insulating protective layers 30, as shown in FIG. 5.

Step 6: cutting along the respective dicing streets 2b to separate the rectangular chips 10 arranged in the array from the wafer 2 and get the respective chip packages 1, as shown in FIG. 6. The thick metal layer 40 of the chip package 1 is wrapped by the insulating protective layer 30 to be protected by the insulating protective layer 30, as shown in FIG. 6 and FIG. 7.

Refer to FIG. 8-15, a second embodiment of the chip package 1 according to the present invention is provided.

The rectangular chip 10 is composed of a first surface 11, a second surface 12 opposite to the first surface 11, and four side surfaces disposed on four lateral sides thereof correspondingly. The four side surfaces are extending and located between the first surface 11 and the second surface 12. At least one die pad 13 is arranged at the first surface 11 and a bump 14 with a certain height is disposed on the respective die pads 13, as shown in FIG. 15. The first surface 11 is provided with at least one protective layer which includes an opening corresponding to the bump 14 for allowing the bump 14 to be exposed, as shown in FIG. 15. A side protective layer 15 is disposed on each of the four side surfaces of the rectangular chip 10, as shown in FIG. 15. The rectangular chip 10 is formed by cutting a wafer 2. A plurality of the rectangular chips 10 arranged in an array and a plurality of dicing streets 2b are disposed on a first surface 2a of the wafer 2. The respective dicing streets 2b are formed between the two adjacent rectangular chips 10 and filled fully with respective 3 minsulating materials, as shown in FIG. 13. The respective insulating materials are cut and divided along with the respective dicing streets 2b to form the respective side protective layers 15 on the four side surfaces of the rectangular chip 10 to enhance protection, as shown in FIG. 15.

The seed layer 20 is covering the second surface 12 of the rectangular chip 10 and provided with a surface 21, as shown in FIG. 15. Size, shape, or thickness of the thick metal layer 40 cam be controlled more precisely by the seed layer 20 so that yield rate of products is improved and production cost at manufacturing end is further reduced.

Figure 12:
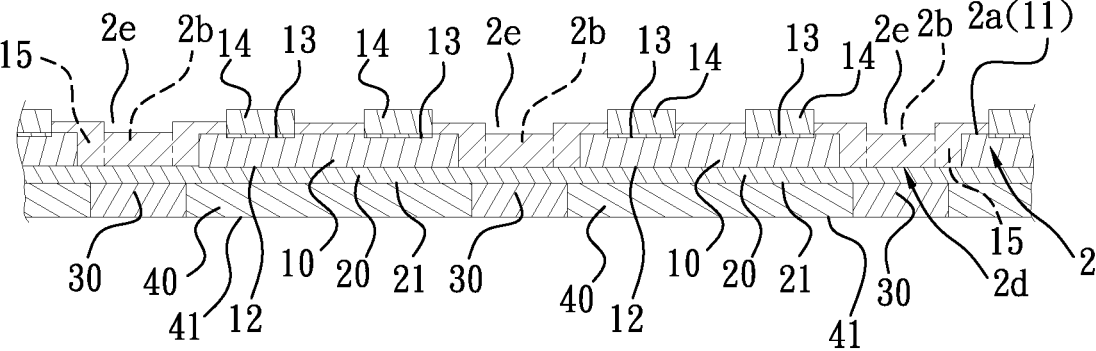
FIG. 12 is a side sectional view showing a plurality of thick metal layers disposed on the surface of the seed layer of the wafer in FIG. 11 according to the present invention.

The insulating protective layer 30 is arranged at a periphery of the surface 21 of the seed layer 20, as shown in FIG. 15. A plurality of the insulating protective layers 30 is disposed on the seed layer 20 of the respective rectangular chips 10 on the wafer 2 and corresponding to the respective dicing streets 2, as shown in FIG. 12. Then the insulating protective layers 30 are cut and divided together with the respective dicing streets 2b, as shown in FIG. 13. Thereby the insulating protective layer 30 is formed on the chip package 1, as shown in FIG. 15.

The insulating protective layer 30 is made of resin materials, but not limited in order to be cut easier than metal materials during wafer dicing.

The thick metal layer 40 is coated on the surface 21 of the seed layer and located on an inner side of the insulating protective layer 30. Thus thick metal layer 40 is wrapped by the insulating protective layer 30 to be protected by the insulating protective layer 30, as shown in FIG. 15. The thick metal layer 40 includes a surface 41 and a protective layer 50 is covering the surface 41 of the thick metal layer 40 correspondingly to strengthen protection, as shown in FIG. 15.

The thick metal layer 40 which is made of copper (but not limited) is used for improving functions such as heat dissipation or electrical resistance of the chip package 1.

Refer to FIG. 8-14, a method of manufacturing the second embodiment of the chip package 1 of the present invention includes the following steps.

Figure 8:
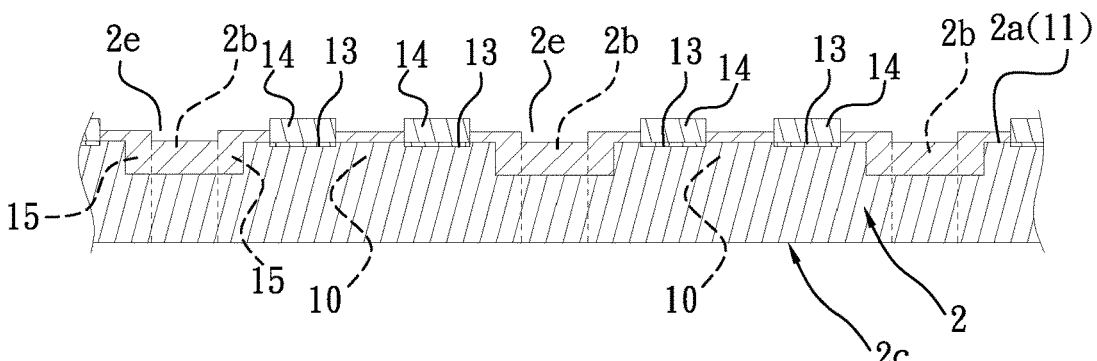
FIG. 8 is a side sectional view of a second embodiment in which a plurality of bumps formed on respective die pads of a wafer according to the present invention.

Step 1: providing a wafer 2 which is provided with a plurality of rectangular chips 10 arranged in an array. Each of the rectangular chips 10 includes a first surface 11, a second surface 12 opposite to the first surface 11, and four side surfaces not only disposed on four lateral sides thereof correspondingly but also extending and located between the first surface 11 and the second surface 12. The first surface 11 of the rectangular chip 10 is provided with at least one protective layer which includes an opening corresponding to a bump 14 for allowing the bump 14 to be exposed, as shown in FIG. 8. At least one die pad 13 is arranged at the first surface 11 and the bump 14 with a certain height is disposed on the respective die pads 13, as shown in FIG. 8. A first surface 2a of the wafer 2 is provided with a plurality of grooves 2e each of which is disposed between the two adjacent rectangular chips 10 and used for defining a dicing street 2b. Thereby the dicing street 2b is formed between the two adjacent rectangular chips 10. A width of the dicing street 2b is smaller than a width of the groove 2e while the groove 2e is filled with insulating materials, as shown in FIG. 8. The wafer 2 further includes a second surface 2c opposite to the first surface 2a, as shown in FIG. 8.

Figure 9:
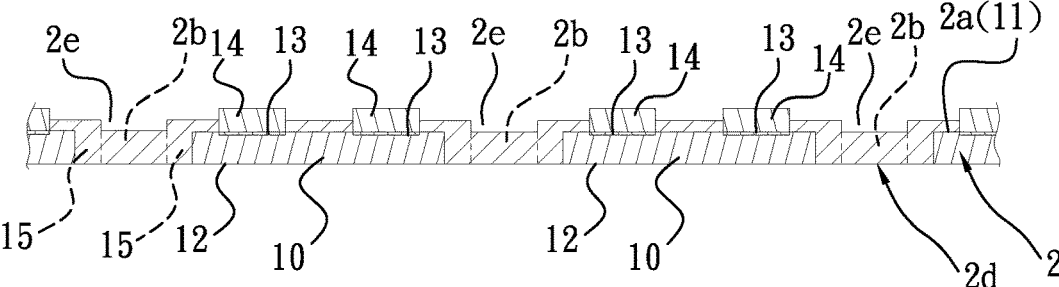
FIG. 9 is a side sectional view showing a third surface of the wafer in FIG. 8 exposed after grinding according to the present invention.

Step 2: grinding the second surface 2c of the wafer 2 to form a third surface 2d, as shown in FIG. 8 and FIG. 9, and the second surface 12 of the respective rectangular chips 10 is exposed on the third surface 2d of the wafer 2, as shown in FIG. 9.

Figure 10:
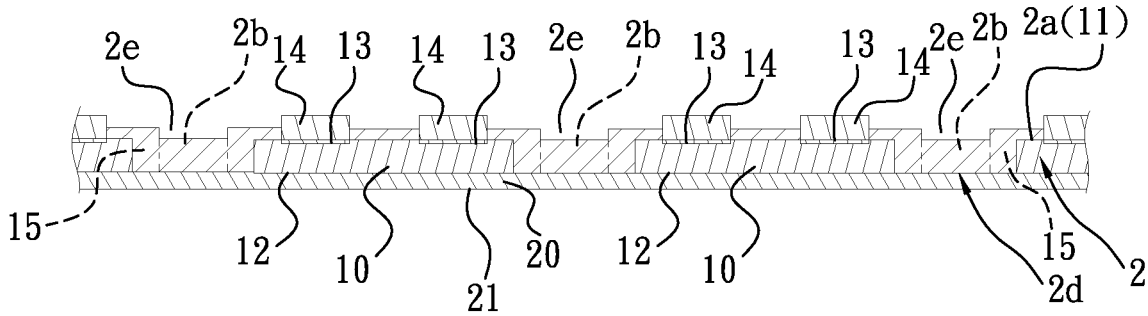
FIG. 10 is a side sectional view showing a plurality of insulating protective layers disposed on a surface of the wafer in FIG. 9 according to the present invention.

Step 3: covering the third surface 2d of the wafer 2 with a plurality of seed layers 20 so that the second surface 12 of the respective rectangular chips 10 is provided and covered with the seed layer 20, as shown in FIG. 10. The seed layer 20 is provided with a surface 21, as shown in FIG. 10.

Figure 11:
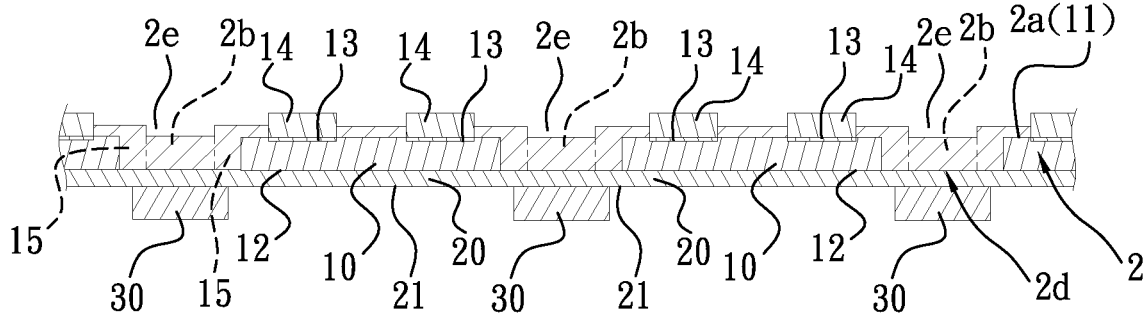
FIG. 11 is a side sectional view showing a plurality of seed layers arranged at a surface of the wafer in FIG. 10 according to the present invention.

Step 4: disposing a plurality of the insulating protective layers 30 on the surface 21 of the seed layer 20 correspondingly and the respective insulating protective layers 30 are corresponding to the respective dicing streets 2b, as shown in FIG. 11. A width of the respective insulating protective layers 30 is larger than a width of the respective dicing streets 2b, as shown in FIG. 11.

Step 5: coating a plurality of thick metal layers 40 on the seed layer 20 correspondingly and the respective thick metal layers 40 are located on an inner side of the respective insulating protective layers 30, as shown in FIG. 12. Each of the thick metal layers 40 is provided with a surface 41, as shown in FIG. 12.

Step 6: covering and providing the surface 41 of the respective thick metal layers 40 with a protective layer 50, as shown in FIG. 13.

Step 7: cutting along the respective dicing streets 2b to separate the rectangular chips 10 arranged in the array from the wafer 2 and get the respective chip packages 1 while the thick metal layer 40 of the chip package 1 is wrapped by the insulating protective layer 30 to be protected by the insulating protective layer 30, as shown in FIG. 14. The insulating materials in the respective grooves 2e are also cut along with the respective dicing streets 2b to form the side protective layer 15 on each of the four side surfaces of the rectangular chip 10 of the chip package 1, as shown in FIG. 14.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalent.

The invention claimed is:

1. A chip package comprising:
   a rectangular chip which consists of a first surface, a second surface opposite to the first surface, at least one die pad and at least one protective layer which are both arranged over the first surface, and a bump with a certain height disposed over the die pad; the protective layer is provided with an opening corresponding to the bump for allowing the bump to be exposed; wherein the rectangular chip is formed by cutting a wafer and a first surface of the wafer is provided with a plurality of the rectangular chips in an array and a plurality of dicing streets while and the dicing street is formed between the two adjacent rectangular chips;

a seed layer covering the second surface of the rectangular chip and provided with a surface;

an insulating protective layer which is mounted to a periphery of the surface of the seed layer;

wherein a plurality of insulating protective layers is disposed on the seed layer of the respective rectangular chips on the wafer and corresponding to the respective dicing streets for being cut together with the respective dicing streets; thus the insulating protective layer is formed on the chip package; and a thick metal layer coated on the surface of the seed layer and located on an inner side of the insulating protective layer so that the thick metal layer is wrapped by the insulating protective layer to be protected by the insulating protective layer.

2. The chip package as claimed in claim 1, wherein the insulating protective layer is made of resin material.

3. The chip package as claimed in claim 1, wherein the thick metal layer is made of copper.

4. A chip package comprising:

a rectangular chip which includes a first surface, a second surface opposite to the first surface, and four side surfaces disposed on four lateral sides of the rectangular chip correspondingly while the four side surfaces are extending and located between the first surface and the second surface;

wherein at least one die pad is arranged at the first surface and a bump with a certain height is disposed on the die pads; wherein the first surface is provided with at least one protective layer which includes an opening corresponding to the bump for allowing the bump to be exposed;

wherein a side protective layer is disposed on each of the four side surfaces of the rectangular chip;

wherein the rectangular chip is formed by cutting a wafer while a plurality of the rectangular chips arranged in an array and a plurality of dicing streets are both disposed on a first surface of the wafer; each of the dicing streets is formed between the two adjacent rectangular chips and filled fully with insulating materials which are cut and divided along with the dicing streets to form the side protective layers on the four side surfaces of the rectangular chip of the chip package;

a seed layer covering the second surface of the rectangular chip and provided with a surface;

an insulating protective layer which is mounted to a periphery of the surface of the seed layer;

wherein a plurality of insulating protective layers is disposed on the seed layer of the respective rectangular chips on the wafer and corresponding to the respective dicing streets for being cut together with the respective dicing streets; thus the insulating protective layer is formed on the chip package; and a thick metal layer coated on the surface of the seed layer and located on an inner side of the insulating protective layer to be wrapped by the insulating protective layer and protected by the insulating protective layer;

wherein the thick metal layer is provided with a surface and the surface of the thick metal layer is covered with a protective layer.

5. The chip package as claimed in claim 4, wherein the insulating protective layer is made of resin material.

6. The chip package as claimed in claim 4, wherein the thick metal layer is made of copper.

* * * * *